(12) United States Patent
Xing et al.

(10) Patent No.: US 12,137,539 B1
(45) Date of Patent: Nov. 5, 2024

(54) ELECTRONIC DEVICE HEAT DISSIPATION SYSTEM WITH SUGAR ALCOHOL PHASE CHANGE MATERIAL ENERGY STORAGE UNIT AND ELECTRONIC DEVICE HEAT DISSIPATION METHOD

(71) Applicant: Beihang University, Beijing (CN)

(72) Inventors: Yuming Xing, Beijing (CN); Jianbao Yin, Beijing (CN); Xu Hou, Beijing (CN); Yuliang Gao, Beijing (CN)

(73) Assignee: Beihang University, Beijing (CN)

( * ) Notice: Subject to any disclaimer, the term of this patent is extended or adjusted under 35 U.S.C. 154(b) by 0 days.

(21) Appl. No.: 18/660,979

(22) Filed: May 10, 2024

(30) Foreign Application Priority Data

Oct. 9, 2023 (CN) .......................... 202311296353.6

(51) Int. Cl.
H05K 7/20 (2006.01)

(52) U.S. Cl.
CPC ..... *H05K 7/20381* (2013.01); *H05K 7/20254* (2013.01); *H05K 7/20263* (2013.01); *H05K 7/20272* (2013.01); *H05K 7/20409* (2013.01)

(58) Field of Classification Search
None
See application file for complete search history.

(56) References Cited

U.S. PATENT DOCUMENTS

| | | | | |
|---|---|---|---|---|
| 9,681,589 B1 * | 6/2017 | Ross | .................... | H05K 5/0211 |
| 10,458,678 B2 * | 10/2019 | Trant | ...................... | F25B 39/04 |
| 11,421,914 B2 * | 8/2022 | Liu | .......................... | F25B 30/06 |
| 2022/0008999 A1 * | 1/2022 | Friesth | ..................... | C23C 4/04 |

FOREIGN PATENT DOCUMENTS

CN 117042420 B * 12/2023

OTHER PUBLICATIONS

CNIPA, Notification of First Office Action for CN202311296353.6, Nov. 17, 2023.
Beihang University (Applicant), Reply to Notification of First Office Action for CN202311296353.6, w/ (allowed) replacement claims, Nov. 27, 2023.
CNIPA, Notification to grant patent right for invention in CN202311296353.6, Nov. 30, 2023.

* cited by examiner

*Primary Examiner* — Courtney L Smith
(74) *Attorney, Agent, or Firm* — Hemisphere Law, PLLC; Zhigang Ma (57) ABSTRACT

An electronic device heat dissipation system with a sugar alcohol PCM energy storage unit includes a cooling circulation pipeline, a heat dissipation cold plate, an energy storage heat exchanger, a crystal powder feeder, and a radiator. Fluid in the cooling circulation pipeline flows sequentially through the heat dissipation cold plate and the energy storage heat exchanger, and the fluid flowing out of the energy storage heat exchanger can optionally pass through the radiator. The energy storage heat exchanger is filled with a sugar alcohol PCM as an energy storage medium, the energy storage medium can absorb heat, melt, solidify and regenerate, and the crystal powder feeder input crystal powder of the energy storage medium to improve a solidification and regeneration speed of the energy storage medium. Heat storage capacity of the sugar alcohol PCM is used, combined with the radiator and the heat dissipation cold plate to achieve temperature control.

6 Claims, 5 Drawing Sheets

FIG. 4B ness, ELECTRONIC DEVICE HEAT DISSIPATION
SYSTEM WITH SUGAR ALCOHOL PHASE
CHANGE MATERIAL ENERGY STORAGE
UNIT AND ELECTRONIC DEVICE HEAT
DISSIPATION METHOD

CROSS-REFERENCE TO RELATED
APPLICATION

This application claims priority to Chinese Patent Application No. CN202311296353.6, filed Oct. 9, 2023, which is herein incorporated by reference in its entirety.

TECHNICAL FIELD

The disclosure relates to the field of electronic device thermal control, and more particularly to an electronic device heat dissipation system with a sugar alcohol phase change material (PCM) energy storage unit and an electronic device heat dissipation method.

BACKGROUND

Operating in high temperature environments can seriously damage reliability and life of electronic devices. With the rapid development of integrated circuits, performance continues to improve while heat power is also increasing. A traditional heat dissipation technology requires an external low-temperature environment as a heat sink, generally atmosphere, fresh water, seawater, etc. The heat transfer process is enhanced by heat pipes, fins, heat exchangers, fans, and other equipment to meet heat dissipation power requirements. However, for some scenarios, such as high temperature environment or adiabatic environment, the external environment cannot be used as the heat sink, at this time, a solid-liquid PCM can temporarily store heat to realize temperature control and heat dissipation of the electronic devices. After the electronic devices finish working and return to a low-temperature environment, the heat stored in the solid-liquid PCM is dissipated, and the heat storage-exhaust cycle is completed.

In this field, there is a need for a faster and more effective heat dissipation mechanism, which can meet the heat dissipation needs of electronic devices with high power and high heat flux, and has a high heat storage density. The density of sugar alcohol PCM is in a range of 1.2-1.4 grams per cubic centimeter (g/cm³), the latent heat of the sugar alcohol PCM is in a range of 220-320 joule per gram (J/g), and the volumetric latent heat of the sugar alcohol PCM is 155%-430% of that of paraffin PCM. The production of the sugar alcohol PCM mainly relies on plants as raw materials, and the sugar alcohol PCM is green and environmentally friendly, and has great potential.

SUMMARY

In order to solve above technical problems, the disclosure provides an electronic device heat dissipation system with a sugar alcohol PCM energy storage unit and an electronic device heat dissipation method, to solve problems in the related art, and the disclosure used below technical solutions.

The electronic device heat dissipation system includes a cooling circulation pipeline, a heat dissipation cold plate, an energy storage heat exchanger, a crystal powder feeder, and a radiator.

The cooling circulation pipeline is configured to flow out fluid, and the fluid is configured to flow sequentially through the heat dissipation cold plate and the energy storage heat exchanger, and then optionally pass through the radiator, and the heat dissipation cold plate is fixed on an electronic device.

The energy storage heat exchanger is filled with an energy storage medium, the energy storage medium can absorb heat and melt as well as solidify and regenerate, and the crystal powder feeder is configured to input crystal powder of the energy storage medium to improve a solidification and regeneration speed of the energy storage medium.

In an embodiment, the energy storage heat exchanger includes a heat exchanger shell, a first coil, and a second coil, the first coil, the second coil and the energy storage medium are all disposed inside the heat exchanger shell, the first coil and the second coil form a parallel structure, and the fluid is configured to flow through the first coil and the second coil.

In an embodiment, a fluid output end of the energy storage heat exchanger is connected to an output pipeline and the radiator, the radiator and the output pipeline form a parallel structure, the output pipeline is connected to an input end of a three-way valve, the radiator is connected to another input end of the three-way valve, and an output end of the three-way valve is connected to the cooling circulation pipeline.

In an embodiment, the crystal powder feeder includes a cross tube, a piston, and a feeding hopper, the cross tube defines a first through hole and a second through hole inside, an end of the first through hole is used as a gas outlet and another end of the first through hole is used as a gas inlet, the gas outlet is connected to a gas injection pipeline of the energy storage heat exchanger, the gas inlet is supplied with gas, the piston is slidably inserted into the second through hole and pushed to slide by a driving device, and the piston defines a radial hole matched with an output end of the feeding hopper.

The feeding hopper is configured to place the crystal powder, when the radial hole of the piston aligns with the output end of the feeding hopper, an end of the piston blocks the first through hole, the crystal powder enters the radial hole, and when the piston slides to align the radial hole with the first through hole, the gas with the crystal powder is output.

In an embodiment, the heat dissipation cold plate includes a heat dissipation cold plate shell, a deflector, and a microchannel fin, the heat dissipation cold plate shell is buckled onto the microchannel fin and defines a flow cavity, the deflector is disposed in the flow cavity to guide flow to a fin portion of the microchannel fin, and the heat dissipation cold plate shell and the microchannel fin define a flow cavity inlet and a flow cavity outlet which are connected to the cooling circulation pipeline.

In an embodiment, the energy storage medium is a sugar alcohol PCM.

In an embodiment, the electronic device heat dissipation method includes following steps.

The fluid in the cooling circulation pipeline passes through the heat dissipation cold plate and the energy storage heat exchanger sequentially, and the heat dissipation cold plate is fixed on the electronic device.

The fluid from the energy storage heat exchanger passes through the radiator optionally.

The energy storage heat exchanger is filled with the energy storage medium, the energy storage medium can absorb heat and melt as well as solidify and regenerate, and when the energy storage medium needs to solidify and regenerate, the crystal powder feeder inputs the gas with the crystal powder into the energy storage heat exchanger.

In an embodiment, the electronic device heat dissipation method includes at least four heat dissipation modes below.

A heat storage mode: a phase change temperature of the energy storage medium is lower than a safe operating threshold temperature of the electronic device, and the fluid passes through the energy storage heat exchanger, heat generated by the electronic device is all absorbed and stored by the energy storage heat exchanger, and the fluid does not pass through the heat exchanger.

A heat storage-heat dissipation mode: a part of the heat generated by the electronic device is absorbed by the energy storage heat exchanger, another part of the heat generated by the electronic device is dissipated by the radiator, and the fluid passes through the radiator.

A heat dissipation mode: when the energy storage medium is melted completely, all of the heat generated by the electronic device is dissipated by the radiator, and the fluid passes through the radiator.

A heat discharge mode: the electronic device stops running, the energy storage medium solidifies and regenerates, the fluid passes through the radiator, and the crystal powder feeder inputs the gas with the crystal powder into the energy storage heat exchanger.

In an embodiment, a particle size of the crystal powder input during a solidification process of the energy storage medium is larger than a critical nucleation radius to promote crystallization, and a calculation formula for the critical nucleation radius is:

$$r_c = \frac{2\gamma T^*}{\Delta H_f \Delta T}$$

where $\gamma$ represents surface energy, $T^*$ represents a solid-liquid equilibrium temperature, and $\Delta H_f$ represents latent heat of phase change.

The disclosure has following beneficial effects: The disclosure utilizes heat storage capacity of the sugar alcohol PCM, combined with the radiator and the heat dissipation cold plate, to achieve temperature control of the electronic device with high power and high heat flux. When the electronic device is working (i.e., in operation), latent heat of PCM melting is utilized to absorb the heat generated by the electronic device, and the radiator can be used to supplement heat dissipation. When the electronic device finishes working, the heat in PCM is dissipated, and inert gas and solid PCM powder are input to promote nucleation and solidification, allowing PCM to regenerate and complete a working cycle. The disclosure combines heat storage and dissipation to meet temperature control requirements of the electronic devices with high power and high heat flux.

DETAILED DESCRIPTION OF EMBODIMENTS

A clear and complete description of the technical solution in the embodiments of the disclosure is provided below, in conjunction with FIG. 1 to FIG. 4B. Apparently, the described embodiments are only a part of the embodiments of the disclosure, not all of the embodiments of the disclosure. Unless otherwise specified, technical means used in the embodiments are conventional means well-known to those skilled in the art.

Figure 1:
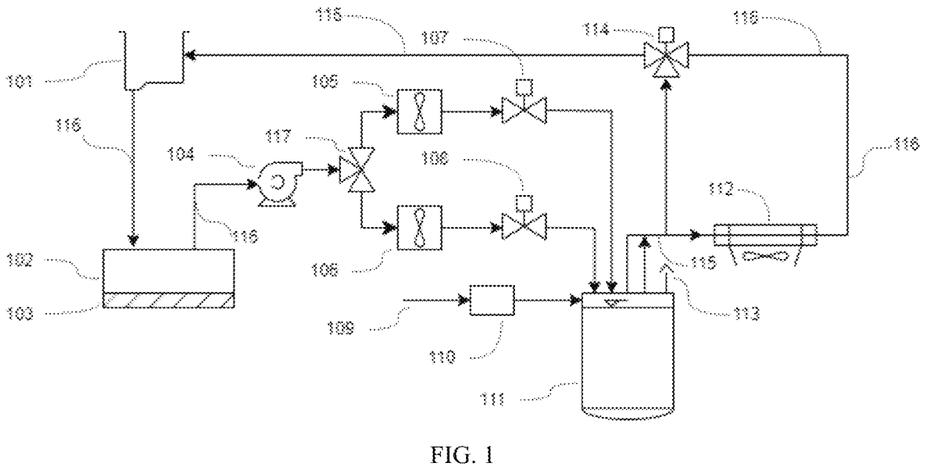
FIG. 1 illustrates a schematic diagram of an electronic device heat dissipation system of the disclosure.

An electronic device heat dissipation system includes a cooling circulation pipeline 116, a heat dissipation cold plate 102, an energy storage heat exchanger 111, a crystal powder feeder 110, and a radiator 112. The cooling circulation pipeline 116 is configured to flow out fluid, and the fluid is configured to flow sequentially through the heat dissipation cold plate 102 and the energy storage heat exchanger 111, and then optionally pass through the radiator 112, and the heat dissipation cold plate 102 is fixed on an electronic device 103. The energy storage heat exchanger 111 is filled with an energy storage medium, the energy storage medium can absorb heat and melt as well as solidify and regenerate, and the crystal powder feeder 110 is configured to input crystal powder of the energy storage medium to improve a solidification and regeneration speed of the energy storage medium.

Specifically, in the disclosure, the energy storage medium is preferably a sugar alcohol PCM. The sugar alcohol PCM can absorb heat and melt as well as solidify and regenerate. For electronic devices with a temperature control requirement of 100 degrees Celsius (° C.), an erythritol/xylitol eutectic material is preferably selected as the energy storage medium, and for electronic devices with a temperature control requirement of 150° C., erythritol is preferably selected as the energy storage medium. A purpose of the crystal powder feeder 110 is to input crystal powder particles corresponding to the sugar alcohol PCM material, promote nucleation and crystallization of the energy storage medium, and achieve solidification and regeneration of the energy storage medium.

The cooling circulation pipeline 116 of the disclosure is provided with a reservoir 101, the reservoir 101 saves the fluid for transferring heat, the fluid is preferably liquid heat transfer fluid. The fluid is configured to pass through the reservoir 101 and then enter the heat dissipation cold plate 102, the heat dissipation cold plate 102 is fixed on the electronic device 103 which is heating. There is sufficient installation pressure between the heat dissipation cold plate 102 and the electronic device 103 to ensure good contact. A fluid output end of the heat dissipation cold plate 102 is connected to a pump 104, the fluid is configured to pass through the pump 104 to increase pressure and keep liquid circulation, enter the energy storage heat exchanger 111, and then optionally pass through or bypass the radiator 112 under different operating conditions. The term "optionally" referred to in the disclosure refers to the fluid passing through or not passing through the radiator 112. The radiator 112 is preferably a radiator with a fan.

Figure 2A:
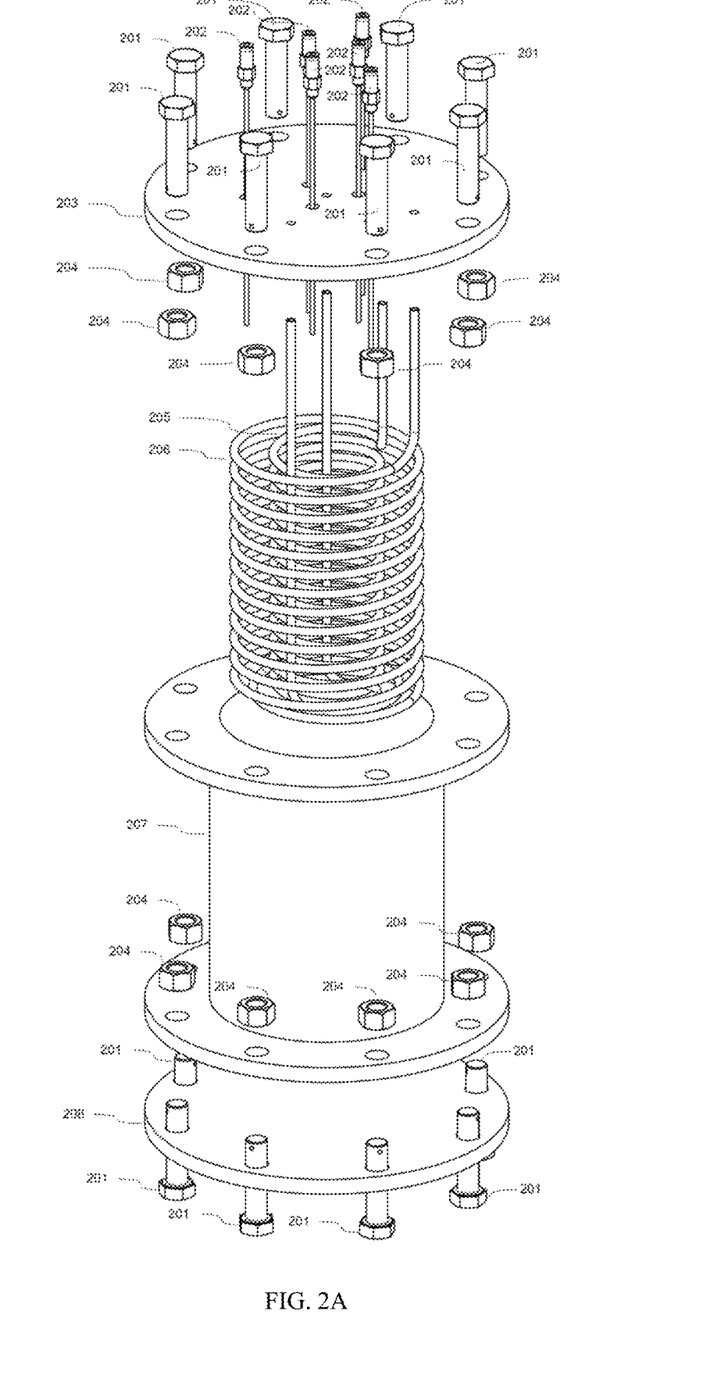
FIG. 2A illustrates a schematic exploded view of an energy storage heat exchanger.
Figure 2B:
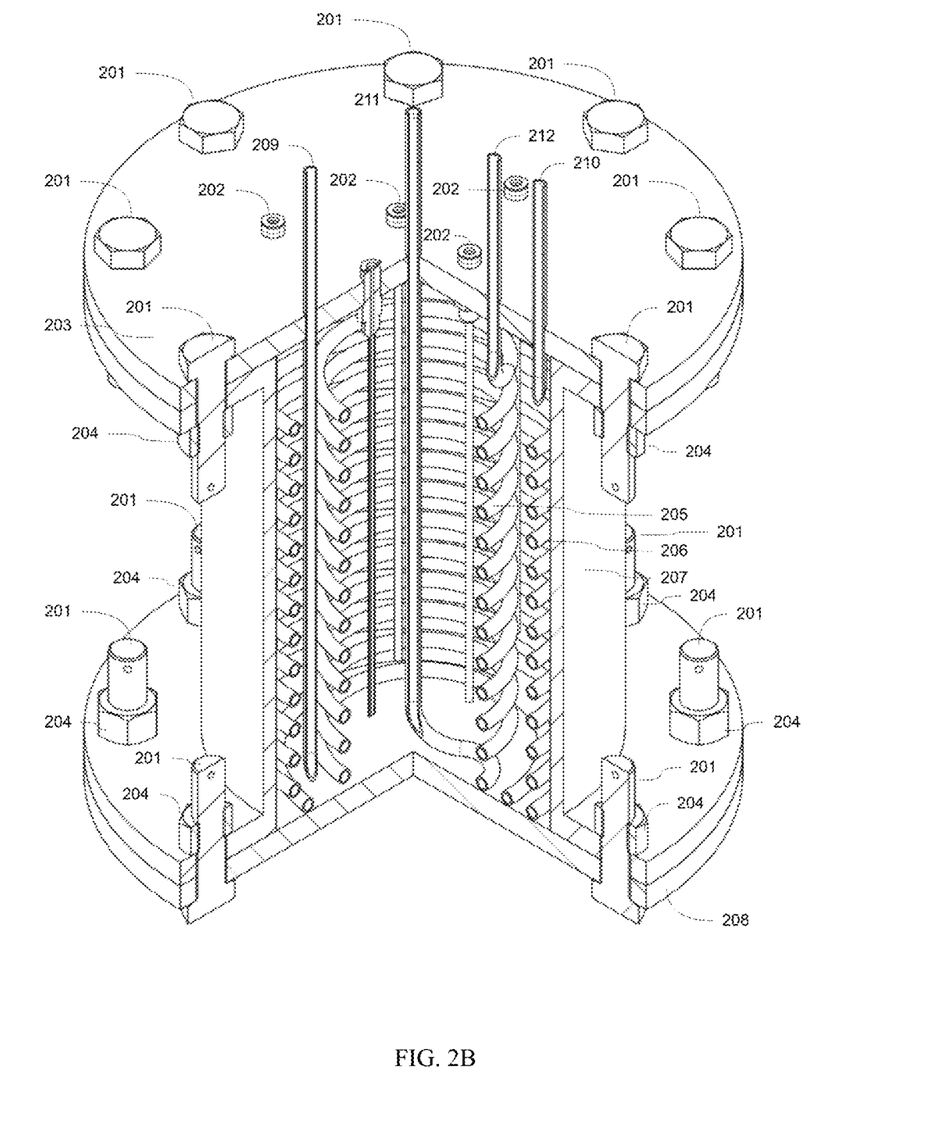
FIG. 2B illustrates a schematic sectional view of the energy storage heat exchanger.

Referring to FIG. 2A and FIG. 2B, the energy storage heat exchanger 111 includes a heat exchanger shell 207, a first coil 205, and a second coil 206, the first coil 205, the second coil 206 and the energy storage medium are all disposed inside the heat exchanger shell 207, the first coil 205 and the second coil 206 form a parallel structure, and the fluid is configured to flow through the first coil 205 and the second coil 206.

Furthermore, a fluid output end of the energy storage heat exchanger 111 is connected to an output pipeline 115 and the radiator 112, the radiator 112 and the output pipeline 115 form a parallel structure, the output pipeline 115 is connected to an input end of a three-way valve 114, the radiator 112 is connected to another input end of the three-way valve 114, and an output end of the three-way valve 114 is connected to the cooling circulation pipeline 116.

Specifically, a top of the heat exchanger shell 207 is sealed by a top orifice plate 203, a bottom of the heat exchanger shell 207 is sealed by a bottom blind plate 208. The top orifice plate 203 and the bottom blind plate 208 can be fastened respectively by bolts 201 and nuts 204. The first coil 205 and the second coil 206 have a helical structure, with the first coil 205 disposed inside the second coil 206, i.e., an inner diameter of the second coil 206 is greater than an outer diameter of the first coil 205. The coil is preferably made of purple copper and has a high thermal conductivity. Multi-layer coils can be used to improve heat transfer uniformity, ensure uniform temperature of the energy storage medium, and improve heat transfer efficiency.

Upper parts of the first coil 205 and the second coil 206 extend outward from the energy storage heat exchanger 111 and are fixed on the top orifice plate 203, the upper part of the first coil 205 defines a first inlet 211 and a first outlet 212, and the upper part of the second coil 206 defines a second inlet 209 and a second outlet 210.

The first inlet 211 is connected to a first flow meter 105, the first flow meter 105 is connected to an output end of a tee joint 117, the second inlet 209 is connected to a second flow meter 106, the second flow meter 106 is connected to another output end of the tee joint 117, an input end of the tee joint 117 is connected to the pump 104, the second inlet 209 and the second outlet 210 form a circuit, the circuit is connected to the output pipeline 115, and the output end of the three-way valve 114 is connected to the reservoir 101. The first flow meter 105 and the second flow meter 106 are disposed in two pipelines separately, the two pipelines are provided with a first solenoid valve 107 and a second solenoid valve 108, respectively.

After passing through the tee joint 117, the fluid for transferring heat is configured to pass through the first flow meter 105 and the second flow meter 106, in conjunction with the first solenoid valve 107 and the second solenoid valve 108 to control fluid flow in each path. Two paths of the fluid is configured to enter two coils (i.e., the first coil 205 and the second coil 206) of the energy storage heat exchanger 111 respectively, pass through or bypass the radiator 112 under control of the three-way valve 114 in different working modes, and then return to the reservoir 101 to complete circulation.

Figure 4A:
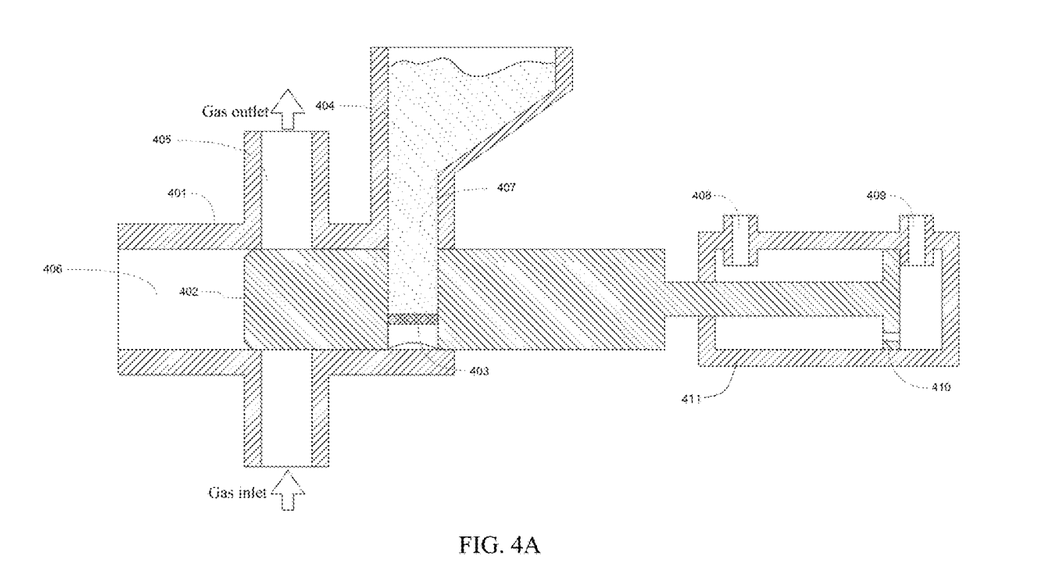
FIG. 4A illustrates a schematic state diagram of a crystal powder feeder when filling powder.
Figure 4B:
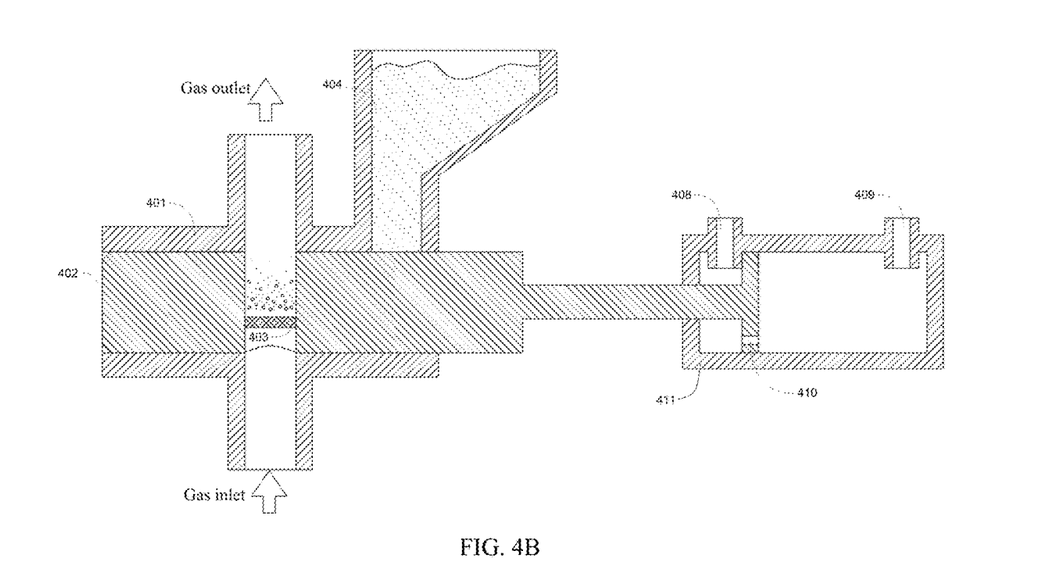
FIG. 4B illustrates a schematic state diagram of the crystal powder feeder when delivering powder.

Referring to FIG. 4A and FIG. 4B, the crystal powder feeder 110 includes a cross tube 401, a piston 402, and a feeding hopper 404, the cross tube 401 defines a first through hole 405 and a second through hole 406 inside, an end of the first through hole 405 is used as a gas outlet and another end of the first through hole 405 is used as a gas inlet, the gas outlet is connected to a gas injection pipeline 202 of the energy storage heat exchanger 111, the gas inlet is supplied with gas, the piston 402 is slidably inserted into the second through hole 406 and pushed to slide by a driving device 411, the piston 402 defines a flow-restriction hole 410 and is pushed to slide under a liquid pressure difference between a first pressure inlet 408 and a second pressure inlet 409 of the driving device 411, and the piston 402 defines a radial hole 407 matched with an output end of the feeding hopper 404. The feeding hopper 404 is configured to place crystal powder, when the radial hole 407 of the piston 402 aligns with an output end of the feeding hopper 404, an end of the piston 402 blocks the first through hole 405, the crystal powder enters the radial hole 407, and when the piston 402 slides to align the radial hole 407 with the first through hole 405, the gas with the crystal powder is output.

Specifically, the feeding hopper 404 is filled with solid sugar alcohol PCM powder. A particle size of the powder (i.e., the solid sugar alcohol PCM powder) should be controlled as small as possible on the basis of being able to form nucleation cores. FIG. 4A shows a powder filling process, the radial hole 407 of the piston 402 moves to align with the output end of the feeding hopper 404. The powder naturally falls under gravity and is blocked by a filter screen 403, the filter screen 403 is fixed in the radial hole 407. A pore diameter of the filter screen 403 should be smaller than the particle diameter of the powder. FIG. 4B shows a powder delivery process. The radial hole 407 of the piston 402 moves to align with the first through hole 405. When introducing inert gas, the gas enters from below and blows out above. The gas plays a role in fluidizing the powder, carrying the powder into the energy storage heat exchanger 111. The driving device 411 can be based on the related art, such as electromagnetic actuators, cylinders, electric cylinders, etc.

In addition, the gas inlet of the cross tube 401 is connected to an inert gas output device 109, such as a gas tank. The gas outlet of the cross tube 401 is connected to the gas injection pipeline 202, the gas injection pipeline 202 is fixed on the top orifice plate 203 and connected to an interior of the heat exchanger shell 207. The energy storage heat exchanger 111 also defines a one-way exhaust port 113, discharging excess gas outward during gas injection.

Figure 3A:
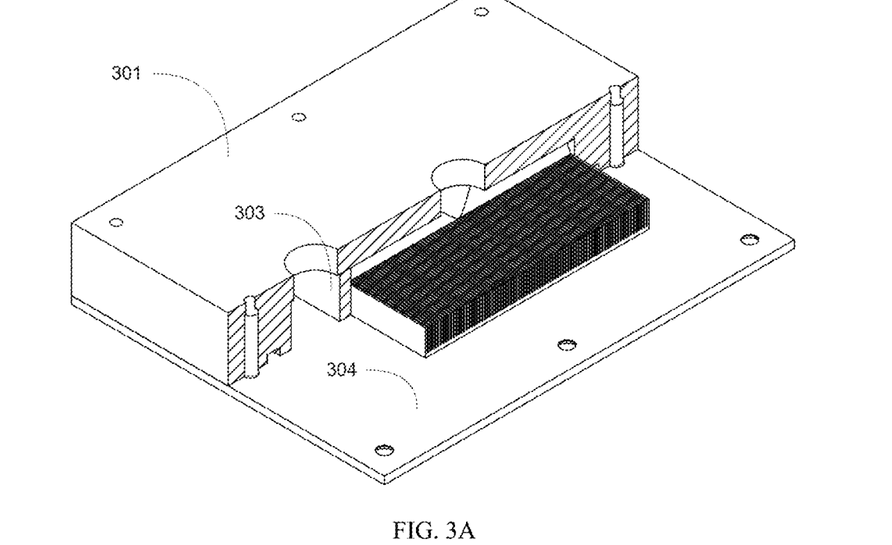
FIG. 3A illustrates a schematic sectional axonometric view of a heat dissipation cold plate.
Figure 3B:
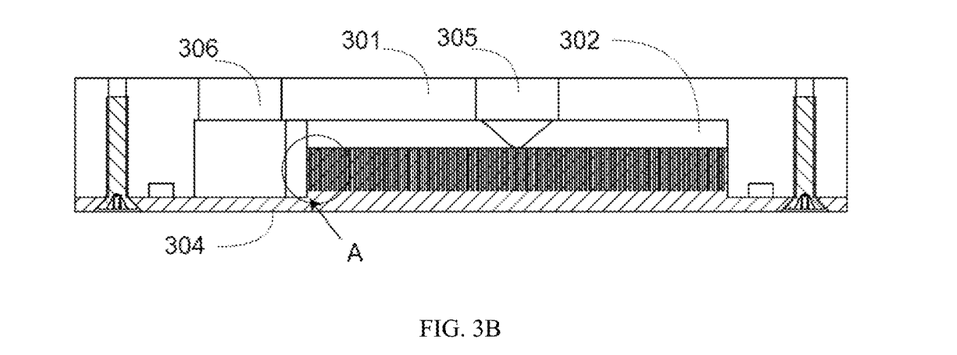
FIG. 3B illustrates a schematic side sectional view of the heat dissipation cold plate.
Figure 3C:
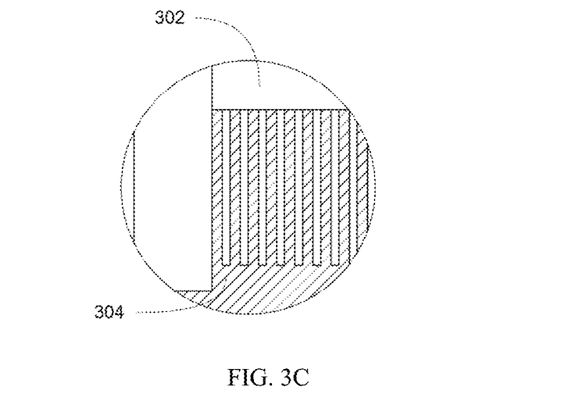
FIG. 3C illustrates a schematic enlarged view of a position A in FIG. 3B.

Referring to FIG. 3A to FIG. 3C, the heat dissipation cold plate 102 includes a heat dissipation cold plate shell 301, a deflector 303, and a microchannel fin 304, the heat dissipation cold plate shell 301 is buckled onto the microchannel fin 304 and defines a flow cavity 302, the deflector 303 is disposed in the flow cavity 302 to guide flow to a fin portion of the microchannel fin 304, the fluid is configured to be evenly distributed to each microchannel groove of the fin portion and forms a jet to further enhance heat transfer. The heat dissipation cold plate shell 301 and the microchannel fin 304 define a flow cavity inlet 305 and a flow cavity outlet which are connected to the cooling circulation pipeline 116. The fluid is configured to flow through the fin portion to absorb heat, flow out from two sides of the fin portion, and then be discharged through the flow cavity outlet 306 of the flow cavity 302. The flow cavity inlet 305 is connected to the reservoir 101, the flow cavity outlet 306 is connected to the pump 104. The microchannel fin 304 is made of high thermal conductivity metal material, preferably copper.

An electronic device heat dissipation method includes following steps.

The fluid in the cooling circulation pipeline 116 passes through sequentially the heat dissipation cold plate 102 and the energy storage heat exchanger 111, and the heat dissipation cold plate 102 is fixed on the electronic device 103.

The fluid from the energy storage heat exchanger 111 passes through the radiator 112 optionally.

The energy storage heat exchanger 111 is filled with the energy storage medium, the energy storage medium can absorb heat and melt as well as solidify and regenerate, and when the energy storage medium needs to solidify and regenerate, the crystal powder feeder 110 inputs the gas with the crystal powder into the energy storage heat exchanger 111.

The electronic device heat dissipation method and the electronic device heat dissipation system of the disclosure include at least four heat dissipation modes below.

A heat storage mode: the electronic device heat dissipation system is in a high-temperature environment or a poor heat dissipation environment, a phase change temperature of the energy storage medium is lower than a safe operating threshold temperature of the electronic device 103, and the fluid passes through the energy storage heat exchanger 111, heat generated by the electronic device 103 is all absorbed and stored by the energy storage heat exchanger 111, and the fluid does not pass through the heat exchanger 112. The three-way valve 114 is rotated to a state that the radiator 112 is bypassed to reduce liquid circuit resistance.

A heat storage-heat dissipation mode: a part of the heat generated by the electronic device 103 is absorbed by the energy storage heat exchanger 111, another part of the heat generated by the electronic device 103 is dissipated by the radiator 112, and the fluid passes through the radiator 112. The phase transition process is not a completely isothermal process, due to a fact that a heat absorption process of PCM is a transient heat transfer process. With an increase of heat storage, a temperature of the PCM increases, temperature difference between the PCM and the thermal fluid decreases, and heat storage power decreases. The radiator 112 can be used to supplement heat dissipation capacity. At this time, the three-way valve 104 is rotated to connect the radiator 112 in series with the energy storage heat exchanger 111 to form a fluid circuit.

A heat dissipation mode: when the energy storage medium is melted completely, all of the heat generated by the electronic device 103 is dissipated by the radiator 112, and the fluid passes through the radiator 112 to maintain low-power operation of the electronic device 103.

A heat discharge mode: the electronic device 103 stops running, the energy storage medium solidifies and regenerates, the fluid passes through the radiator 112. The PCM discharges heat from a melting state through the radiator 112. Due to poor nucleation and crystallization ability of the sugar alcohol PCM, when the PCM is still a molten liquid, the inert gas is input, passes through the crystal powder feeder 110 and carry the crystal powder into the energy storage heat exchanger 111 to stimulate secondary nucleation of the sugar alcohol PCM and increase a rate of the crystallization and heat release.

The crystal powder is the solid sugar alcohol PCM powder. The particle size of the powder should be small enough on the basis that is larger than a critical nucleation radius to form sufficient nucleation cores in liquid PCM. A calculation formula for the critical nucleation radius is:

$$r_c = \frac{2\gamma T^*}{\Delta H_f \Delta T}$$

where $\gamma$ represents surface energy, $T^*$ represents a solid-liquid equilibrium temperature, and $\Delta H_f$ represents latent heat of phase change.

In addition, in the disclosure, a controller, (which may be a programmable logic controller) is included to control automatic switching of the different heat dissipation modes. The energy storage heat exchanger 111 can be provided with a temperature sensor inside to detect a temperature of the energy storage medium in real time. The first solenoid valve 107 and the second solenoid valve 108 are automatically controlled by the controller. The melting state is determined by the temperature sensor inside the energy storage heat exchanger 111. A flow rate is controlled by adjusting opening and closing sizes of the first solenoid valve 107 and the second solenoid valve 108, and heat exchange power is distributed between the two circuits to improve uniformity of temperature distribution inside the energy storage heat exchanger 111. The three-way valve 114 is automatically controlled by the controller, the controller automatically switches between the four working modes by detecting an external state of the system, a working state of the electronic device 103 which is heating, and the melting state of the energy storage medium. The pump 104 is automatically controlled by the controller to adjust a total liquid flow rate of the heat dissipation circuit.

Above embodiment described is only a description of a preferred way of the disclosure, not a limitation of the scope of the disclosure, without departing from the spirit of the design of the disclosure, various deformations, variations, modifications, and substitutions made to the technical solutions of the disclosure by those skilled in the art shall fall within the scope of protection as determined by the claims of the disclosure.

What is claimed is:

1. An electronic device heat dissipation system, comprising:
   a cooling circulation pipeline, a heat dissipation cold plate, an energy storage heat exchanger, a crystal powder feeder, and a radiator;
   wherein the cooling circulation pipeline is configured to flow out fluid, and the fluid is configured to flow sequentially through the heat dissipation cold plate and the energy storage heat exchanger, and then optionally pass through the radiator; and the heat dissipation cold plate is fixed on an electronic device (103);
   wherein the energy storage heat exchanger is filled with an energy storage medium, the energy storage medium is capable of absorbing heat and melting as well as solidifying and regenerating, and the crystal powder feeder is configured to input crystal powder of the energy storage medium to improve a solidification and regeneration speed of the energy storage medium;
   wherein the energy storage heat exchanger comprises: a heat exchanger shell, a first coil, and a second coil; the first coil, the second coil and the energy storage medium are all disposed inside the heat exchanger shell, the first coil and the second coil form a parallel structure, and the fluid is configured to flow through the first coil and the second coil;
   wherein a fluid output end of the energy storage heat exchanger is connected to an output pipeline and the radiator, the radiator and the output pipeline form a parallel structure, the output pipeline is connected to an input end of a three-way valve, the radiator is connected to another input end of the three-way valve, and an output end of the three-way valve is connected to the cooling circulation pipeline;

wherein upper parts of the first coil and the second coil extend outward from the energy storage heat exchanger and are fixed on a top orifice plate, the upper part of the first coil defines a first inlet and a first outlet, and the upper part of the second coil defines a second inlet and a second outlet;

wherein the first inlet is connected to a first flow meter, the first flow meter is connected to an output end of a tee joint, the second inlet is connected to a second flow meter, the second flow meter is connected to another output end of the tee joint, an input end of the tee joint is connected to a pump, the second inlet and the second outlet forms a circuit, the circuit is connected to the output pipeline, and the output end of the three-way valve is connected to a reservoir;

wherein the fluid for transferring heat is configured to pass through the tee joint and divide into two paths, and the two paths of the fluid are configured to enter the first coil and the second coil separately, pass through the radiator or bypass the radiator under different working modes, and then return to the reservoir to complete circulation; and the different working modes are switched by control of the three-way valve based on detected temperature; and wherein the energy storage medium is a sugar alcohol phase change material (PCM).

2. The electronic device heat dissipation system as claimed in claim 1, wherein the crystal powder feeder comprises a cross tube, a piston, and a feeding hopper, the cross tube defines a first through hole and a second through hole inside, an end of the first through hole is used as a gas outlet and another end of the first through hole is used as a gas inlet, the gas outlet is connected to a gas injection pipeline of the energy storage heat exchanger, the gas inlet is supplied with gas, the piston is slidably inserted into the second through hole and pushed to slide by a driving device, and the piston defines a radial hole matched with an output end of the feeding hopper; and wherein the feeding hopper is configured to place the crystal powder, when the radial hole of the piston aligns with the output end of the feeding hopper, an end of the piston blocks the first through hole, the crystal powder enters the radial hole, and when the piston slides to align the radial hole with the first through hole, the gas with the crystal powder is output.

3. The electronic device heat dissipation system as claimed in claim 1, wherein the heat dissipation cold plate comprises a heat dissipation cold plate shell, a deflector, and a microchannel fin, the heat dissipation cold plate shell is buckled onto the microchannel fin and defines a flow cavity, the deflector is disposed in the flow cavity to guide flow to a fin portion of the microchannel fin, and the heat dissipation cold plate shell and the microchannel fin define a flow cavity inlet and a flow cavity outlet which are connected to the cooling circulation pipeline.

4. An electronic device heat dissipation method applied to the electronic device heat dissipation system as claimed in claim 1, comprising:

passing through, by the fluid in the cooling circulation pipeline, sequentially the heat dissipation cold plate and the energy storage heat exchanger, wherein the heat dissipation cold plate is fixed on the electronic device; and passing through, by the fluid from the energy storage heat exchanger, the radiator optionally;

wherein the energy storage heat exchanger is filled with the energy storage medium, the energy storage medium is capable of absorbing heat and melting as well as solidifying and regenerating, and when the energy storage medium needs to solidify and regenerate, the crystal powder feeder inputs the gas with the crystal powder into the energy storage heat exchanger.

5. The electronic device heat dissipation method as claimed in claim 4, wherein the different working modes comprise at least four heat dissipation modes:

a heat storage mode, wherein a phase change temperature of the energy storage medium is lower than a safe operating threshold temperature of the electronic device, and the fluid passes through the energy storage heat exchanger, heat generated by the electronic device is all absorbed and stored by the energy storage heat exchanger, and the fluid does not pass through the heat exchanger;

a heat storage-heat dissipation mode, wherein a part of the heat generated by the electronic device is absorbed by the energy storage heat exchanger, another part of the heat generated by the electronic device is dissipated by the radiator, and the fluid passes through the radiator;

a heat dissipation mode, wherein when the energy storage medium is melted completely, the heat generated by the electronic device is dissipated by the radiator, and the fluid passes through the radiator; and a heat discharge mode, wherein the electronic device stops running, the energy storage medium solidifies and regenerates, the fluid passes through the radiator, and the crystal powder feeder inputs the gas with the crystal powder into the energy storage heat exchanger.

6. The electronic device heat dissipation method as claimed in claim 4, wherein a particle size of the crystal powder input during a solidification process of the energy storage medium is larger than a critical nucleation radius to promote crystallization, and a calculation formula for the critical nucleation radius is:

$$r_c = \frac{2\gamma T^*}{\Delta H_f \Delta T},$$

wherein $\gamma$ represents surface energy, $T^*$ represents a solid-liquid equilibrium temperature, $\Delta H_f$ represents latent heat of phase change and $\Delta T$ represents an undercooling degree of the sugar alcohol PCM.

* * * * *